US010008593B2

(12) United States Patent
Chiu et al.

(10) Patent No.: US 10,008,593 B2
(45) Date of Patent: Jun. 26, 2018

(54) RADIO FREQUENCY SEMICONDUCTOR DEVICE

(71) Applicant: MediaTek Inc., Hsin-Chu (TW)

(72) Inventors: Chih-Chung Chiu, Zhunan Township, Miaoli County (TW); Puo-Yu Chiang, Su'ao Township, Yilan County (TW)

(73) Assignee: MediaTek Inc., Hsin-Chu (TW)

( * ) Notice: Subject to any disclaimer, the term of this patent is extended or adjusted under 35 U.S.C. 154(b) by 8 days.

(21) Appl. No.: 14/576,301

(22) Filed: Dec. 19, 2014

(65) Prior Publication Data

US 2016/0181418 A1 Jun. 23, 2016

(51) Int. Cl.
*H01L 29/78* (2006.01)
*H01L 21/265* (2006.01)
*H01L 29/66* (2006.01)
*H01L 29/10* (2006.01)
*H01L 29/08* (2006.01)

(52) U.S. Cl.
CPC .... *H01L 29/7816* (2013.01); *H01L 21/26513* (2013.01); *H01L 29/086* (2013.01); *H01L 29/1095* (2013.01); *H01L 29/66659* (2013.01); *H01L 29/66681* (2013.01); *H01L 29/7833* (2013.01); *H01L 29/7835* (2013.01); *H01L 29/0878* (2013.01)

(58) Field of Classification Search
None
See application file for complete search history.

(56) References Cited

U.S. PATENT DOCUMENTS

| 6,392,275 B1* | 5/2002 | Jang | H01L 21/8249 257/335 |
|---|---|---|---|
| 7,125,777 B2* | 10/2006 | Cai | H01L 21/823425 257/E21.417 |
| 7,812,393 B2* | 10/2010 | Williams | H01L 21/761 257/335 |
| 8,629,027 B1 | 1/2014 | Bulucea et al. | |

(Continued)

OTHER PUBLICATIONS

De Souza, M.M., et al.; "Design for Reliability—The RF Power LDMOSFET;" IEEE Transactions on Device and Materials Reliability; vol. 7; No. 1; Mar. 2007; pp. 162-174.

(Continued)

*Primary Examiner* — Abul Kalam
(74) *Attorney, Agent, or Firm* — Wolf, Greenfield & Sacks, P.C.

(57) ABSTRACT

A semiconductor device includes a well region of a first conductivity type, having a first depth, formed in a substrate. A source contact region of a second conductivity type is formed in the well region. A drift region of the second conductivity type, having a second depth greater than 50% of the first depth, is formed in the substrate adjacent to the well region. A drain contact region of the second conductivity type is formed in the drift region. A gate electrode is formed on the substrate between the source contact region and the drain contact region. The drain contact region is spaced apart from the gate electrode and the source contact region is adjacent to the gate electrode. Furthermore, a method of fabricating a semiconductor device is also provided. The method includes performing a multi-step implantation process to form a drift region.

19 Claims, 6 Drawing Sheets

(56) References Cited

U.S. PATENT DOCUMENTS

| | | | |
|---|---|---|---|
| 9,000,517 B2* | 4/2015 | Chu | H01L 29/7816 257/336 |
| 9,236,472 B2* | 1/2016 | Chen | H01L 29/7835 |
| 9,306,034 B2* | 4/2016 | Tu | H01L 29/66681 |
| 2001/0000288 A1* | 4/2001 | Oh | H01L 29/0847 257/409 |
| 2002/0036328 A1* | 3/2002 | Richards, Jr. | H01L 29/7835 257/401 |
| 2005/0151207 A1* | 7/2005 | Moscatelli | H01L 21/28167 257/395 |
| 2007/0120184 A1* | 5/2007 | Cai | H01L 29/7835 257/335 |
| 2007/0246771 A1* | 10/2007 | McCormack | H01L 29/0878 257/335 |
| 2007/0278568 A1 | 12/2007 | Williams et al. | |
| 2008/0067588 A1* | 3/2008 | Williams | H01L 21/761 257/343 |
| 2008/0224214 A1* | 9/2008 | Lu | H01L 29/1083 257/347 |
| 2009/0090980 A1* | 4/2009 | King | H01L 29/1083 257/408 |
| 2010/0084686 A1* | 4/2010 | Cai | H01L 21/823425 257/192 |
| 2014/0001517 A1* | 1/2014 | Eklund | H01L 27/0617 257/262 |
| 2014/0264556 A1 | 9/2014 | Lai et al. | |
| 2014/0339636 A1* | 11/2014 | Hsu | H01L 29/7816 257/343 |

OTHER PUBLICATIONS

Cai, J., et al.; "A Novel High Performance Stacked LDD RF LDMOSFET;" IEEE Electron Device Letters; vol. 22; No. 5; May 2001; pp. 236-238.

\* cited by examiner

RADIO FREQUENCY SEMICONDUCTOR DEVICE

BACKGROUND OF THE INVENTION

Field of the Invention

The invention relates to semiconductor devices and more particularly to a structure and a method of fabricating a Radio Frequency Laterally Diffused Metal-Oxide Semiconductor (RF LDMOS) device.

Description of the Related Art

The widespread use of personal communication products, such as cell phones and wireless LANs, has created a demand for semiconductor devices which can provide certain operational characteristics specific to these devices. Radio Frequency (RF) power transistors are used in communication applications as amplifiers in output stages of transmitters in cellular radios.

Laterally Diffused Metal-Oxide Semiconductor (LDMOS) devices are widely used in silicon field-effect transistors (FETs) for RF and microwave power amplifiers for communication applications. Semiconductor devices that are used in applications such as cellular infrastructure are required to operate at high frequencies. RF LDMOS devices are attractive because they provide good performance at frequencies in a range from 700 MHz to about 3.8 GHz.

LDMOS devices have a drift region between a source region and a drain region. The drift region has a high resistance due to a light doping concentration therein. Therefore, the drift region improves breakdown voltages of the LDMOS devices. However, the conventional drift region cannot enhance cutoff frequencies ($f_T$) of RF LDMOS devices.

BRIEF SUMMARY OF THE INVENTION

The disclosure provides structures and methods of fabricating RF LDMOS devices. A drift region of the RF LDMOS devices has a junction depth which can improve cutoff frequencies ($f_T$) of the RF LDMOS devices.

In embodiments of the disclosure, a semiconductor device is provided. The semiconductor device includes a well region of a first conductivity type formed in a substrate. The well region has a first depth. The semiconductor device also includes a source contact region of a second conductivity type formed in the well region. The semiconductor device further includes a drift region of the second conductivity type formed in the substrate adjacent to the well region. The drift region has a second depth. The second depth is greater than 50% of the first depth. In addition, the semiconductor device includes a drain contact region of the second conductivity type formed in the drift region. The semiconductor device also includes a gate electrode formed on the substrate between the source contact region and the drain contact region. The drain contact region is spaced apart from the gate electrode and the source contact region is adjacent to the gate electrode.

In embodiments of the disclosure, a semiconductor device is provided. The semiconductor device includes a first well region of a first conductivity type formed in the substrate. The first well region has a first depth. The semiconductor device also includes a second well region of the first conductivity type formed in the substrate. The second well region has the first depth and is spaced apart from the first well region. The semiconductor device further includes a drift region of a second conductivity type between and adjacent to the first well region and the second well region. The drift region has a second depth greater than 50% of the first depth. In addition, the semiconductor device includes a first source contact region of the second conductivity type formed in the first well region. The semiconductor device also includes a second source contact region of the second conductivity type formed in the second well region. The semiconductor device further includes a drain contact region of the second conductivity type formed in the drift region. In addition, the semiconductor device includes a first gate electrode between the first source contact region and the drain contact region. The semiconductor device also includes a second gate electrode between the second source contact region and the drain contact region. The drain contact region is spaced apart from the first gate electrode and the second gate electrode.

In embodiments of the disclosure, furthermore, a method of fabricating a semiconductor device is provided. The method includes forming a well region of a first conductivity type in a substrate. The well region has a first depth. The method also includes forming a mask on the well region. The mask has an opening to expose a portion of the substrate. The method further includes performing a multi-step implantation process through the opening of the mask to form a drift region of a second conductivity type in the substrate. The drift region is adjacent to the well region. The drift region has a second depth greater than 50% of the first depth. In addition, the method includes removing the mask and forming a gate electrode on the substrate. The method also includes forming a source contact region of the second conductivity type in the well region. The method further includes forming a drain contact region of the second conductivity type in the drift region. The drain contact region is spaced apart from the gate electrode.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
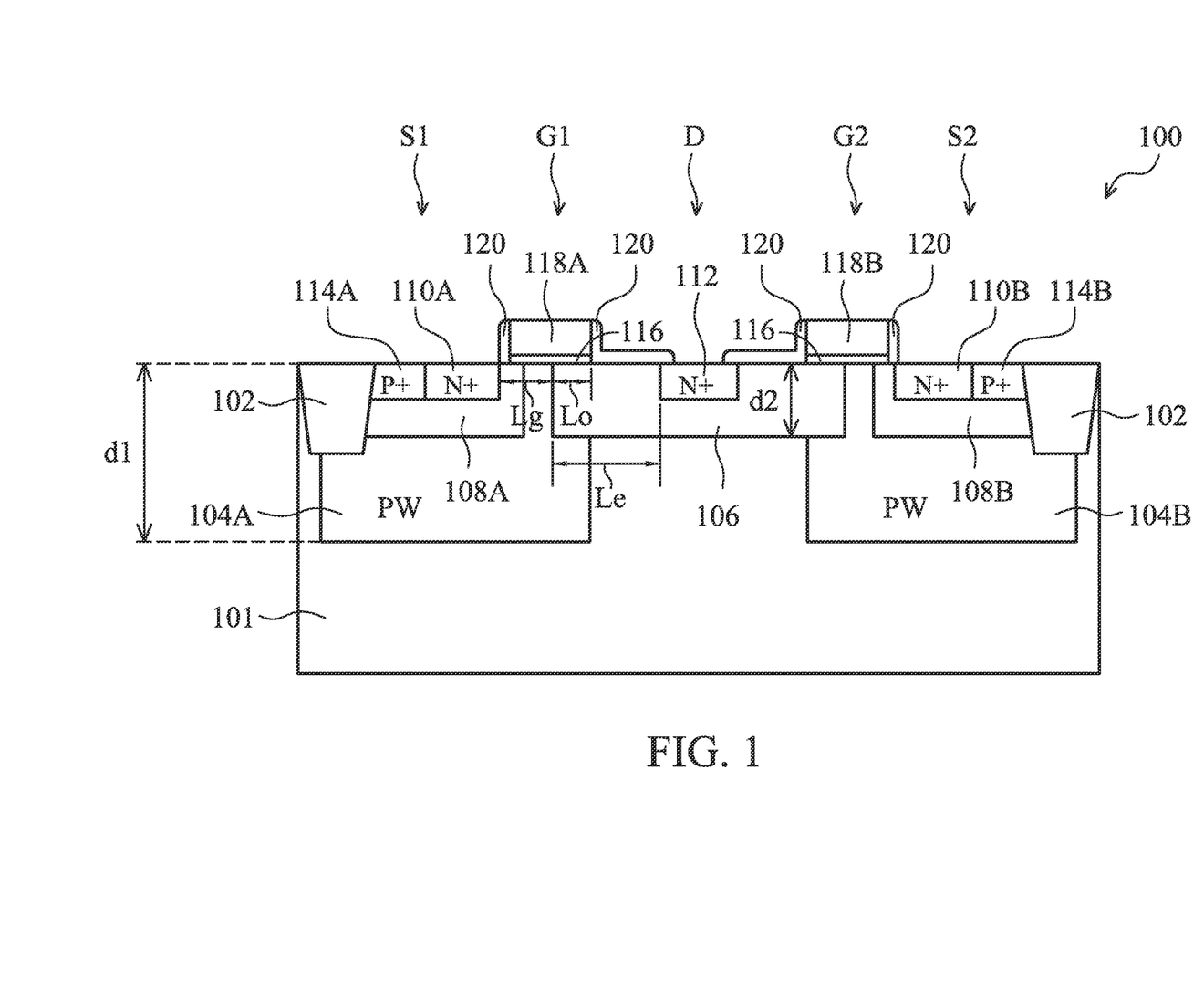
FIG. 1 shows a schematic cross section of a LDMOS device with a shallow junction drift region.

Referring to FIG. 1, a schematic cross section of a LDMOS device 100 having a drift region 106 with a shallow junction depth d2 is shown. The LDMOS device 100 includes a substrate 101 which contains a first conductivity type semiconductor substrate, for example a P$^+$ type silicon substrate and an epitaxial layer of the first conductivity type, for example a P$^-$ type epitaxial layer formed on the P$^+$ type silicon substrate. An isolation structure 102 is formed on the substrate 101 to define an active area surrounded by the isolation structure 102. The isolation structure 102 is for example a field oxide. A first well region 104A and a second well region 104B of the first conductivity type, for example P⁻ well regions are formed in the substrate 101 for a first source side S1 and a second source side S2 respectively. The first well region 104A and the second well region 104B have a junction depth d1.

The drift region 106 of a second conductivity type, for example N⁻ type drift region is formed between the first well region 104A and the second well region 104B for a drain side D. The drift region 106 has a shallow junction depth d2 which is significantly smaller than the junction depth d1 of the first well region 104A and the second well region 104B. The shallow junction depth d2 is about 5%-7% of the depth d1.

A first gate electrode 118A and a second gate electrode 118B are formed over the first well region 104A and the second well region 104B respectively for a first gate side G1 and a second gate side G2. The first and second gate electrodes 118A and 118B can be made of poly-silicon. Moreover, the first and second gate electrodes 118A and 118B can further include a silicide layer formed on poly-silicon. The drift region 106 has a portion laterally diffused under the first gate electrode 118A and the second gate electrode 118B. In addition, a gate dielectric layer 116 is formed over the substrate 101 to separate the first gate electrode 118A and the second gate electrode 118B from the other regions formed in the substrate 101. The gate dielectric layer 116 can be formed from silicon oxide, silicon nitride, silicon oxynitride, or a combination thereof.

A first lightly doped region 108A and a second lightly doped region 108B of the first conductivity type, for example P⁻ type lightly doped regions are formed in the first well region 104A and the second well region 104B respectively. The first lightly doped region 108A and the second lightly doped region 108B are more heavily doped than the first well region 104A and the second well region 104B. A first source contact region 110A and a second source contact region 110B of the second conductivity type, for example N⁻ type heavily doped regions are formed in the first lightly doped region 108A and the second lightly doped region 108B respectively.

A drain contact region 112 of the second conductivity type, for example N⁺ type heavily doped region is formed in the drift region 106. The drain contact region 112 is spaced apart from the first gate electrode 118A and the second gate electrode 118B. The first source contact region 110A and the second source contact region 110B are adjacent to the first gate electrode 118A and the second gate electrode 118B respectively.

Furthermore, a first heavily doped region 114A and a second heavily doped region 114B of the first conductivity type, for example Pᴵ type heavily doped regions are also formed in the first lightly doped region 108A and the second lightly doped region 108B respectively. The first heavily doped region 114A and the second heavily doped region 114B are respectively connected to the first source contact region 110A and the second source contact region 110B to lower the source resistance of the LDMOS device.

In addition, a dielectric layer 120 is formed on the sidewalls of the first gate electrode 118A and the second gate electrode 118B and over the drift region 106. The dielectric layer 120 has openings to expose the first source contact region 110A, a second source contact region 110B, the drain contact region 112, the first heavily doped region 114A and the second heavily doped region 114B for subsequently formed metal layers. The dielectric layer 120 can be formed from silicon oxide, silicon nitride, silicon oxynitride, or a combination thereof.

As shown in FIG. 1, the drift region 106 of the LDMOS device 100 has the shallow junction depth d2 significantly smaller than the junction depth d1 of the first well region 104A and the second well region 104B. Thus, high resistance is produced on the drain side D due to the shallow junction depth d2 of the drift region 106. A cut-off frequency ($f_T$) of the RF LDMOS device 100 is restricted by high resistance on the drain side D. Therefore, the cut-off frequency ($f_T$) of the RF LDMOS device 100 cannot be improved due to the shallow junction depth d2 of the drift region 106.

Figure 2:
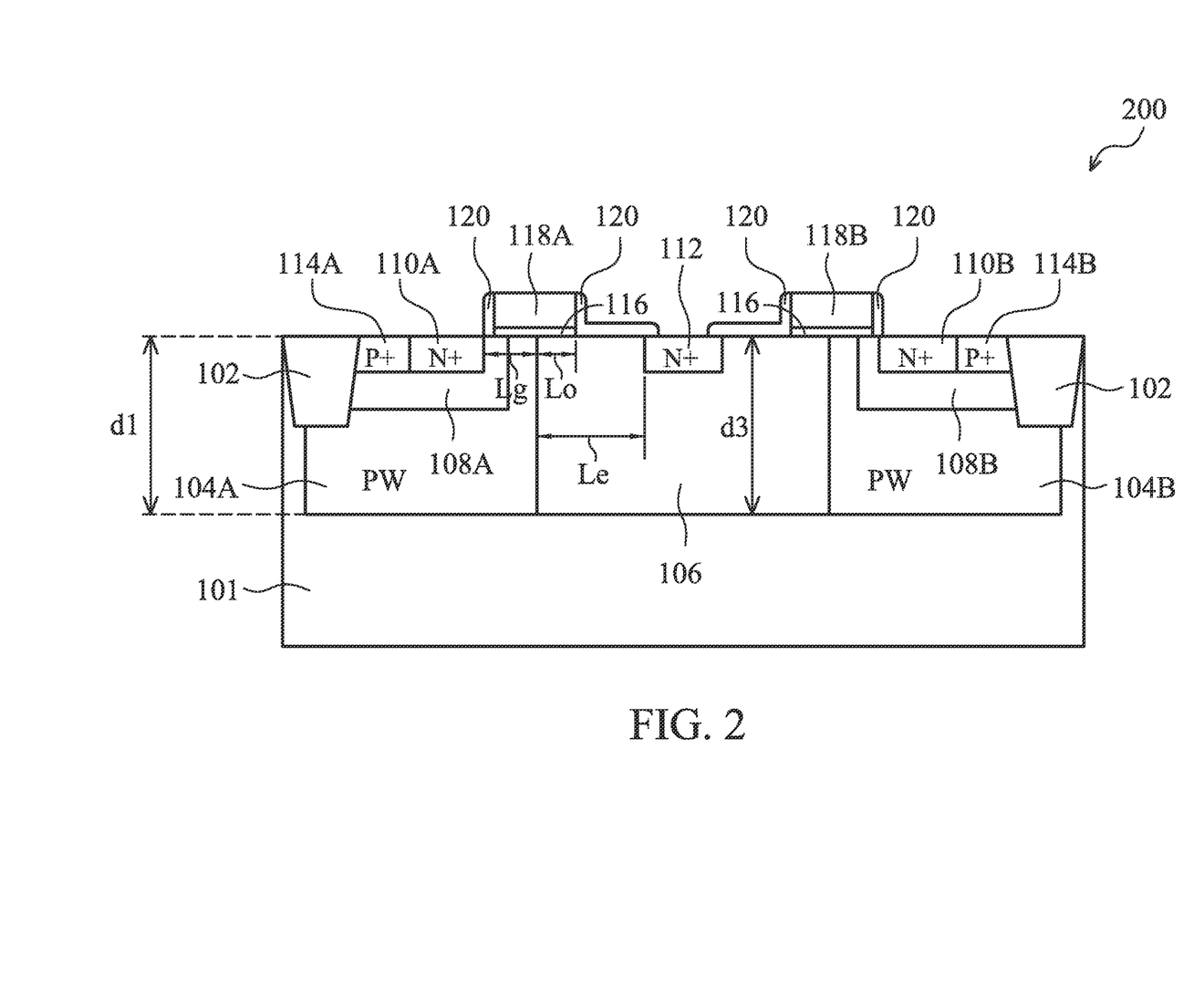
FIG. 2 shows a schematic cross section of a LDMOS device according to some embodiments.

Referring to FIG. 2, a schematic cross section of a LDMOS device 200 according to some embodiments of the disclosure is shown. The LDMOS device 200 has a drift region 106 with a junction depth d3 which is greater than the shallow junction depth d2 of the drift region 106 of the LDMOS device 100. The other regions of the LDMOS device 200 can be the same as that of the LDMOS device 100 and not repeated again herein to simplify the description. In some embodiments, the junction depth d3 of the drift region 106 in the LDMOS device 200 is about 65%-100% of the junction depth d1 of the first well region 104A and the second well region 104B. As mentioned above, the shallow junction depth d2 of the drift region 106 in the LDMOS device 100 is about 5%-7% of the junction depth d1. LDMOS devices 100 have a shallow junction depth d2 of about 5% of the depth d1 whereas LDMOS devices 200 have a junction depth d3 of about 100% of the depth d1. Other regions of the LDMOS devices 100 and 200 are the same. As a result, the cut-off frequency ($f_T$) of RF LDMOS device 200 is about 30% higher than that of RF LDMOS devices 100.

In comparing the cut-off frequencies ($f_T$) of LDMOS device 100 with that of LDMOS device 200 while a channel length Lg, a length Lo (Lg+Lo is equal to a gate length Lpoly) and a drift length Le of the LDMOS devices 100 and 200 are the same. The LDMOS devices 100 have a shallow junction depth d2 of about 5% of depth d1. The LDMOS devices 200 have a junction depth d3 of about 100% of depth d1. In some embodiments, the channel length Lg is in a range of 0.15-0.21 μm, the length Lo is in a range of 0.09-0.18 μm, the gate length Lpoly is in a range of 0.27-0.39 μm and the drift length Le is 0.3 μm. As a result, the maximal cut-off frequencies ($f_T$) of the RF LDMOS devices 100 are in a range of 23.52 GHz to 32.92 GHz. The maximal cut-off frequencies ($f_T$) of the RF LDMOS devices 200 are in a range of 30.01 GHz to 43.42 GHz. This proves that the RF LDMOS devices 200 can increase the cut-off frequencies ($f_T$) by about 10 GHz over than that of the LDMOS devices 100 due to the junction depth d3 of the drift region 106 being comparable to the junction depth d1 of the channel well regions 104A and 104B.

Figure 3A:
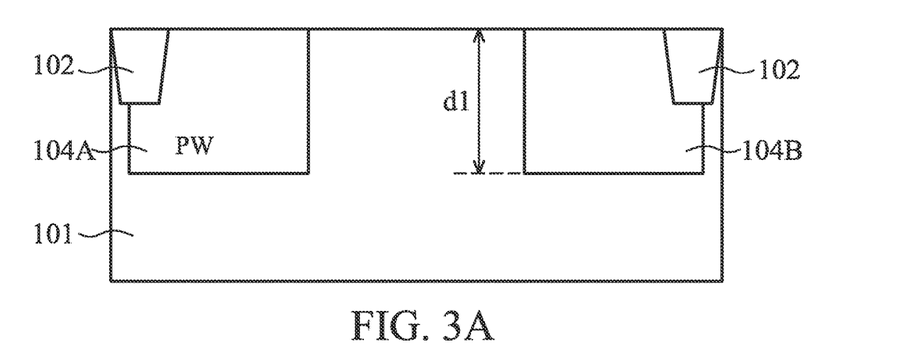
FIGS. 3A-3G show schematic cross sections of several intermediate stages of fabricating the LDMOS device of FIG. 2 according to some embodiments.

FIGS. 3A-3G are schematic cross sections of several intermediate stages of fabricating the LDMOS device 200 of FIG. 2 in accordance with some embodiments. Referring to FIG. 3A, a semiconductor substrate 101 is provided. An isolation structure 102, for example a filed oxide, is formed on the semiconductor substrate 101 by oxidation, photolithography and etching processes. In some embodiments, a first well region 104A and a second well region 104B of a first conductivity type, for example P type, are formed in the semiconductor substrate 101 by a Boron (B) P⁻ implantation process. The first well region 104A and the second well region 104B have a junction depth d1.

Figure 3B:
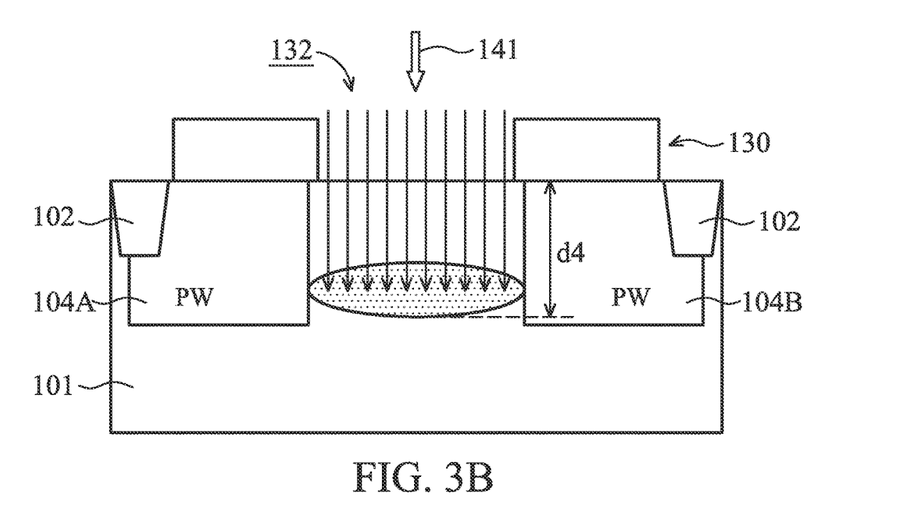

Referring to FIG. 3B, a mask 130, for example a photoresist layer, is formed on the semiconductor substrate 101. The mask 130 has an opening 132 to expose a portion of the semiconductor substrate 101. A first-step implantation process 141 is performed on the semiconductor substrate 101 through the opening 132 of the mask 130 to implant a second conductivity type dopant. In some embodiments, the first-step implantation process 141 is a phosphorus (P) N⁻ implantation with a first dopant dose of about 2E12 to 7E12 ions/cm² and a first implantation energy of about 180 to 300 KeV. A first implantation depth d4 is formed in the semiconductor substrate 101 by the first-step implantation process 141.

Figure 3C:
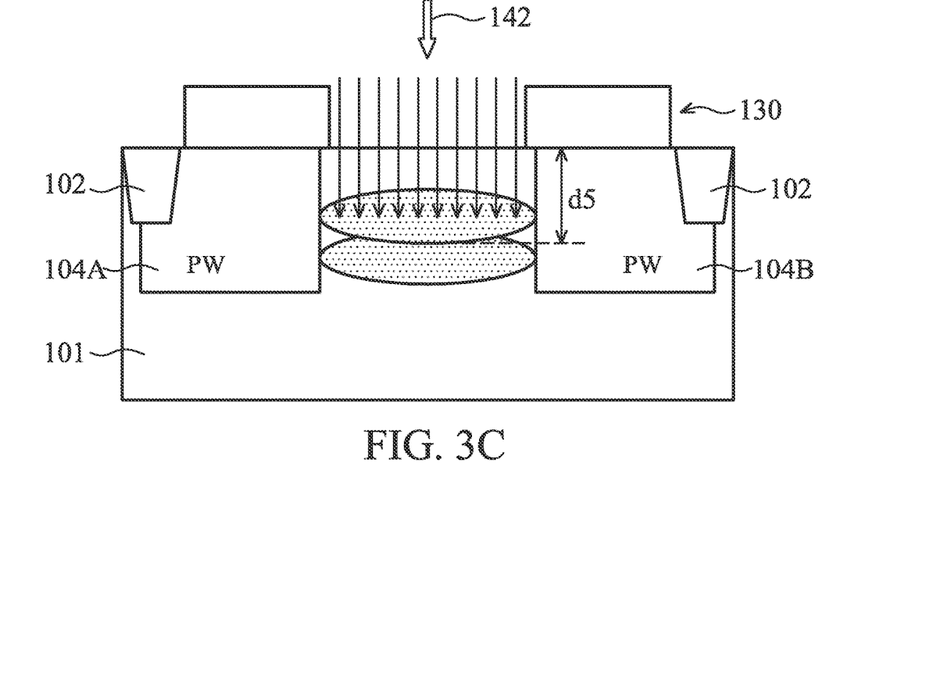

Referring to FIG. 3C, a second-step implantation process 142 is performed on the semiconductor substrate 101 through the opening 132 of the same mask 130. In some embodiments, the second-step implantation process 142 is also a phosphorus N⁻ implantation with a second dopant dose of about 2E12 to 6E12 ions/cm² and a second implantation energy of about 130 to 200 KeV. The second implantation energy of the second-step implantation process 142 is lower than the first implantation energy of the first-step implantation process 141. Therefore, a second implantation depth d5 formed by the second-step implantation process 142 is smaller than the first implantation depth d4 formed by the first-step implantation process 141.

Moreover, in some embodiments, the second dopant dose of the second-step implantation process 142 is different from the first dopant dose of the first-step implantation process 141. Thus, two doped regions having different doping concentrations at different depths are formed by the first step 141 and the second step 142.

In some other embodiments, the second dopant dose of the second-step implantation process 142 is the same as the first dopant dose of the first-step implantation process 141. Thus, two doped regions having uniform doping concentration at different depths are formed by the first step 141 and the second step 142.

Figure 3D:
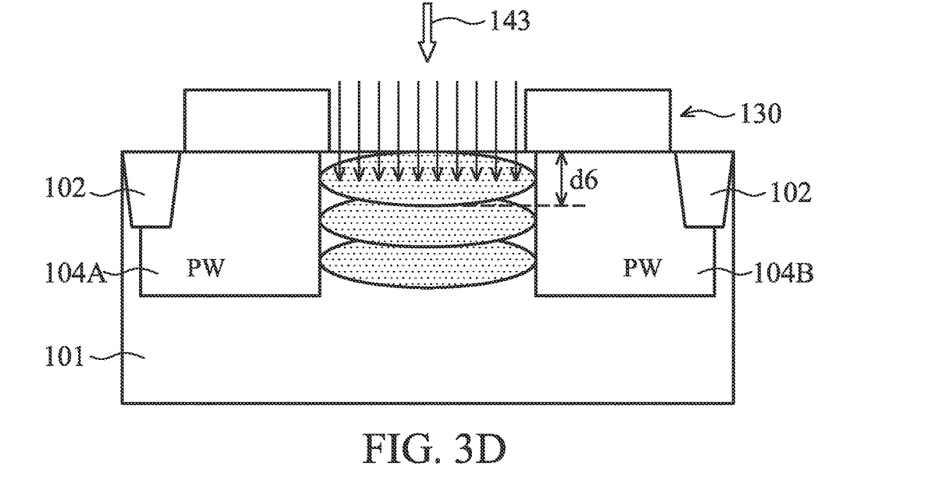

Referring to FIG. 3D, a third-step implantation process 143 is performed on the semiconductor substrate 101 through the opening 132 of the same mask 130. In some embodiments, the third-step implantation process 143 is also a phosphorus (P) N⁻ implantation with a third dopant dose of about 1E12 to 4E12 ions/cm² and a third implantation energy of about 30 to 70 KeV. The third implantation energy of the third-step implantation process 143 is lower than the second implantation energy of the second-step implantation process 142. Thus, a third implantation depth d6 formed by the third-step implantation process 143 is smaller than the second implantation depth d5 formed by the second-step implantation process 142.

Moreover, in some embodiments, the third dopant dose of the third-step implantation process 143 is different from the second dopant dose of the second-step implantation process 142. Thus, three doped regions having different doping concentrations at different depths are formed by the first step 141, the second step 142 and the third step 143.

In some other embodiments, the third dopant dose of the third-step implantation process 143 is the same as the second dopant dose of the second-step implantation process 142. Thus, three doped regions having uniform doping concentration at different depths are formed by the first step 141, the second step 142 and the third step 143.

Figure 3E:
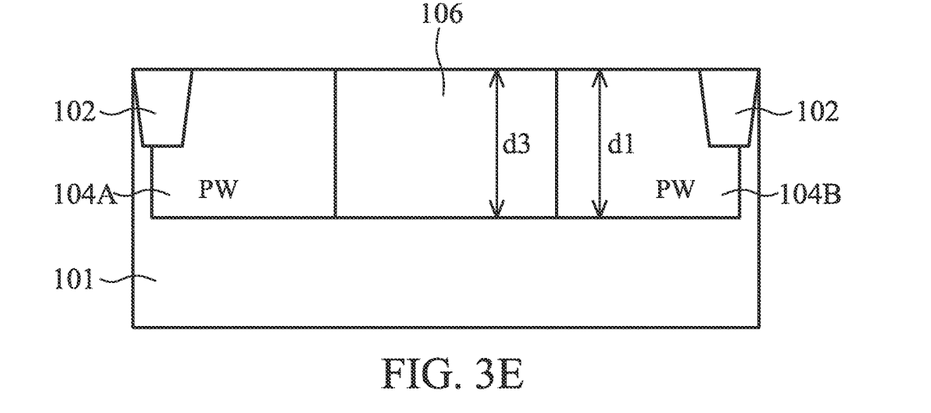

Referring to FIG. 3E, in some embodiments, after the three steps 141-143 of the multi-step implantation process, an annealing process is performed on the semiconductor substrate 101 to form a drift region 106 of the second conductivity type, for example a N⁻ type region. In some embodiments, the drift region 106 has a junction depth d2 which is comparable to the junction depth d1 of the first well region 104A and a second well region 104B.

Although the embodiment of FIGS. 3B-3D shows a three-step implantation process, the other embodiments can use a two-step implantation process or an implantation process of more than three steps to form the drift region 106. In some embodiments, the drift region 106 has a junction depth d2 of about 65% to 100% of the junction depth d1 of the first well region 104A and the second well region 104B. The junction depth d2 of the drift region 106 can be controlled by implantation energies of the multi-step implantation process.

Figure 3F:
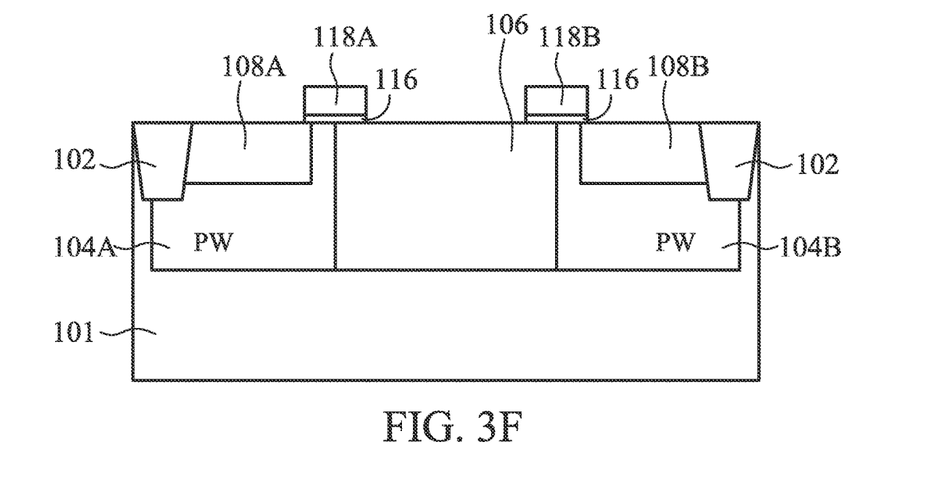

Referring to FIG. 3F, a first gate electrode 118A and a second gate electrode 118B are formed over the semiconductor substrate 101. In some embodiments, the first gate electrode 118A and the second gate electrode 118B are made of poly-silicon. Furthermore, the first gate electrode 118A and the second gate electrode 118B can further include a silicide layer formed on poly-silicon. In addition, a gate dielectric layer 116 is formed on the semiconductor substrate 101 to separate the first and second gate electrodes 118A and 118B from the other regions in the semiconductor substrate, such as the first well region 104A, the drift region 106 and the second well region 104B. In some embodiments, the gate dielectric layer 116 is made of silicon oxide, silicon nitride, silicon oxynitride, or a combination thereof. The first gate electrode 118A, the second gate electrode 118B and the gate dielectric layer 116 can be formed by a deposition, photolithography and etching process.

Also referring to FIG. 3F, a first lightly doped region 108A and a second lightly doped region 108B of the first conductivity type, for example P⁻ type, are formed in the first well region 104A and the second well region 104B respectively. The first and second lightly doped regions 108A and 108B can be formed by a Boron (B) P⁻ implantation process with a mask of a photoresist layer to expose the areas for forming the lightly doped regions 108A and 108B. The first lightly doped region 108A and the second lightly doped region 108B are more heavily doped than the first well region 104A and the second well region 104B.

Figure 3G:
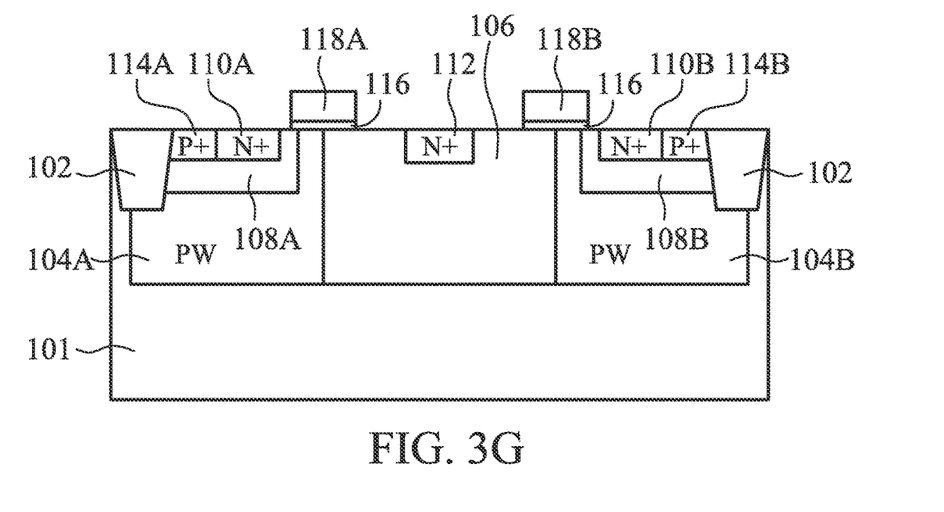

Referring to FIG. 3G, a first source contact region 110A, a second source contact region 110B and a drain contact region 112 of the second conductivity type, for example N⁺ type regions, are formed in the first lightly doped region 108A, the second lightly doped region 108B and the drift region 116 respectively. The contact regions 110A, 110B and 112 can be formed by an As N⁺ implantation process with a mask of a photoresist layer to expose the areas for forming the contact regions 110A, 110B and 112.

Furthermore, a first heavily doped region 114A and a second heavily doped region 114A of the first conductivity type, for example P⁺ type heavily doped regions, are formed in the first lightly doped region 108A and the second lightly doped region 108B respectively. The heavily doped regions 114A and 114B can be formed by a Boron (B) P⁻ implantation process with a mask of a photoresist layer to expose the areas for forming the heavily doped regions 114A and 114B.

Next, a dielectric layer 120 is formed on the sidewalls of the first and second gate electrodes 118A and 118B and also over the drift region 106. The dielectric layer 120 has openings to expose the first source contact region 110A, the second source contact region 110B, the drain contact region 112, the first heavily doped region 114A and the second heavily doped region 114B for subsequently formed metal layers. Then, the fabrication of the RF LDMOS device 200 of FIG. 2 is completed. In some embodiments, the dielectric layer 120 is made of silicon oxide, silicon nitride, silicon oxynitride, or a combination thereof. The dielectric layer 120 can be formed by a deposition, photolithography and etching process.

According to the embodiments of the disclosure, the drift region of the RF LDMOS devices has a junction depth which is greater than 50% of the junction depth of channel well regions or comparable to the junction depth of channel well regions. The junction depth of the drift region of the embodiments can lower resistance on drain side. Cut-off frequencies ($f_T$) of RF LDMOS devices are improved by low resistance on drain side. Therefore, the depth design of the drift region of the disclosure benefits the Cut-off frequencies ($f_T$) performance of the RF LDMOS devices. Moreover, according to the embodiments of the disclosure, the drift region with a junction depth comparable to the junction depth of channel well regions is formed by performing a multi-step implantation process.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a substrate;
a well region of a first conductivity type formed in the substrate, having a first depth;
a source contact region of a second conductivity type formed in the well region;
a drift region of the second conductivity type formed in the substrate adjacent to the well region, having a second depth, wherein the second depth is greater than 50% of the first depth;
a drain contact region of the second conductivity type formed in the drift region;
a gate electrode formed on the substrate between the source contact region and the drain contact region, wherein the drain contact region is spaced apart from the gate electrode and the source contact region is adjacent to the gate electrode; and
a dielectric layer, wherein a first portion of the dielectric layer exhibits L-shape in cross-section and is disposed on a sidewall of the gate electrode, the first portion of the dielectric layer extending over the drift region and contacting the drain contact region such that a portion of the drain contact region is uncovered by the dielectric layer;
wherein a channel length (Lg) is in a range of 0.15-0.21 µm and a maximal cut-off frequency ($f_T$) of the semiconductor device is in a range of 30.01 GHz to 43.42 GHz, wherein the maximal cut-off frequency ($f_T$) is achieved based on the channel length (Lg) and the second depth of the drift region being greater than 50% of the first depth of the well region.

2. The semiconductor device as claimed in claim 1, further comprising a first doped region of the first conductivity type formed in the well region, wherein the first doped region is more heavily doped than the well region, and the source contact region is formed in the first doped region.

3. The semiconductor device as claimed in claim 2, further comprising a heavily doped region of the first conductivity type formed in the first doped region, wherein the heavily doped region is connected to the source contact region.

4. The semiconductor device as claimed in claim 2, wherein the second depth is deeper than the first doped region.

5. The semiconductor device as claimed in claim 1, wherein the drift region includes a plurality of doped regions with different doping concentrations at different depths.

6. The semiconductor device as claimed in claim 1, wherein the drift region has a uniform doping concentration.

7. The semiconductor device as claimed in claim 1, wherein the second depth of the drift region is 65%-100% of the first depth of the well region.

8. The semiconductor device as claimed in claim 1, wherein the second depth is deeper than an isolation structure formed in the substrate.

9. The semiconductor device as claimed in claim 1, wherein a gate length (Lpoly) is in a range of 0.27-0.39 µm.

10. The semiconductor device as claimed in claim 9, wherein a length (Lo) is in a range of 0.09-0.18 µm, and Lg+Lo=Lpoly.

11. The semiconductor device as claimed in claim 10, wherein a drift length Le is 0.3 µm.

12. A semiconductor device, comprising:
a substrate;
a first well region of a first conductivity type formed in the substrate, having a first depth;
a second well region of the first conductivity type formed in the substrate having the first depth and spaced apart from the first well region;
a drift region of a second conductivity type between and adjacent to the first well region and the second well region, wherein the drift region has a second depth greater than 50% of the first depth;
a first source contact region of the second conductivity type formed in the first well region;
a second source contact region of the second conductivity type formed in the second well region;
a drain contact region of the second conductivity type formed in the drift region;
a first gate electrode between the first source contact region and the drain contact region;
a second gate electrode between the second source contact region and the drain contact region; and
a dielectric layer having a first portion and a second portion, wherein the first portion of the dielectric layer exhibits L-shape in cross-section and is disposed on a sidewall of the first gate electrode, extends over the drift region and contacts the drain contact region, wherein the second portion of the dielectric layer exhibits L-shape in cross-section and is disposed on a sidewall of the second gate electrode, extends over the drift region and contacts the drain contact region such that the first portion and the second portion of the dielectric layer expose a portion of the drain contact region uncovered by the dielectric layer,
wherein the drain contact region is spaced apart from the first gate electrode and the second gate electrode; and
wherein a gate length (Lpoly) is in a range of 0.27-0.39 µm and a maximal cut-off frequency ($f_T$) of the semiconductor device is in a range of 30.01 GHz to 43.42 GHz, wherein the maximal cut-off frequency ($f_T$) is achieved based on the gate length (Lpoly) and the second depth of the drift region being greater than 50% of the first depth of the well region.

13. The semiconductor device as claimed in claim 12, wherein the second depth of the drift is 65% to 100% of the first depth of the first and second well regions.

14. The semiconductor device as claimed in claim 12, further comprising a first doped region of the first conductivity type formed in the first well region, and a second doped region of the first conductivity type formed in the second well region, wherein the first and second doped regions are more heavily doped than the first and second well region, the first source contact region is formed in the first doped region, and the second source contact region is formed in the second doped region.

15. The semiconductor device as claimed in claim 14, further comprising a first heavily doped region of the first conductivity type formed in the first doped region, wherein the first heavily doped region is connected to the first source contact region, and a second heavily doped region of the first conductivity type formed in the second doped region, wherein the second heavily doped region is connected to the second source contact region.

16. The semiconductor device as claimed in claim 14, wherein the second depth is deeper than the first doped region and the second doped region.

17. The semiconductor device as claimed in claim 12, wherein the drift region includes a plurality of doped regions with different doping concentrations at different depths.

18. The semiconductor device as claimed in claim 12, wherein the drift region has a uniform doping concentration.

19. The semiconductor device as claimed in claim 12, wherein the second depth is deeper than an isolation structure formed in the substrate.

* * * * *